United States Patent [19]

Fetterly

[11] Patent Number: 5,365,739

[45] Date of Patent: Nov. 22, 1994

[54] COMPACTABLE THERMOELECTRIC COOLER

[76] Inventor: Daniel R. Fetterly, 1846 Preuss Rd., Los Angeles, Calif. 90035-4314

[21] Appl. No.: 196,529

[22] Filed: Feb. 15, 1994

[51] Int. Cl.⁵ .......................................... F25B 21/02
[52] U.S. Cl. .................................. 62/3.62; 62/457.7; 62/457.9; 190/1; 190/107
[58] Field of Search ............... 62/3.2, 3.5, 3.6, 3.62, 62/457.1, 457.2, 457.7, 457.9, 371; 190/1, 2, 107, 125

[56] References Cited

U.S. PATENT DOCUMENTS 3,111,166  11/1963  Munz et al. ............................ 62/3.6
4,759,190  7/1988  Tractenberg et al. ............... 62/3.62

*Primary Examiner*—John M. Sollecito
*Attorney, Agent, or Firm*—Norman B. Rainer

[57] ABSTRACT

A compactable thermally insulated carrier includes a Peltier effect thermal control device mounted in a rectangular block of rigid polymeric foam, a first thermally insulative wall panel adapted to fold about the block, and a second insulative panel adapted to fold upon the first panel. When completely assembled, a rectangular enclosure is formed which is elongated between front and rear extremities. The block is positioned at the rear of the enclosure. A flap, integral with one of the panels, serves as a door for the front extremity. An electric fan causes air to move across vanes to the Peltier device, through a portal in the block, and into the enclosure.

7 Claims, 3 Drawing Sheets

COMPACTABLE THERMOELECTRIC COOLER

BACKGROUND OF THE INVENTION

1. Field of the Invention

This invention concerns a lightweight portable carrier having a thermally insulated chamber which can be heated or cooled.

2. Description of the Prior Art

Food coolers of sufficiently light weight to be comfortably carried by a person are well known. Typically, such coolers are chambers of rigid box-like construction, fabricated of a closed cell polymeric foam such as polystyrene, and provided with a lid and carrying handle. Because of the thermally insulative nature of the foam, articles within the chamber, whether hot or cold by comparison with the temperature of the surrounding ambient air, will tend to remain at reasonably constant temperature for limited periods of time. To compensate for the limited heat transfer that does occur through the walls of the chamber, cooling means in the form of ice or a container of cold or frozen liquid may be located within the chamber to maintain low temperature. Similarly, heating means such as a container of hot liquid, or electrical heating means may be located within the chamber to maintain an elevated temperature.

Although such food-carrying containers are reasonably effective and inexpensive, they occupy considerable space, even when not in use. Furthermore, the traditionally employed cooling means generally occupies a considerable portion of the chamber, and is limited in its duration of effectiveness. For example, in an automobile trip of long duration, ice might not be obtainable at roadside locations to replenish ice which has melted in the cooling chamber. In addition to serving to preserve the freshness of food, the cooling chamber may be utilized preserve medications such as insulin, or to preserve photographic films.

Flexible thermally insulated carrying bags are disclosed in U.S. Pat. Nos. 4,671,393 and 5,005,679. Such carrying bags however, are generally of limited capacity, and usually do not provide adequate thermal insulation or cooling means for long duration periods.

Peltier thermal control devices are based upon the principle that, at the junction of two dissimilar materials through which an electric current passes, caloric heat is produced or absorbed, depending upon the direction of the current. The rate of the caloric effect is proportional to the magnitude of the current. By positioning a multitude of such junctions thermally parallel and electrically in series in a small space such as in a metal block, a significant caloric effect can be produced. Such devices now commercially available with junctions of p-type semiconductor materials in contact with n-type materials are operable on 12 volts direct current, and employ a polarity switch to change from heating to cooling modes. A fan is generally associated with the device to circulate air from the block to the objects or region where the thermal effect is desired.

It is accordingly an object of the present invention to provide a lightweight thermally insulated carrier having a Peltier thermal control device.

It is another object of this invention to provide a carrier as in the foregoing object which is easily compactable to a storage state of relatively small volume.

It is a further object of the present invention to provide a carrier of the aforesaid nature of simple, durable construction amenable to low cost manufacture.

These and other beneficial objects and advantages will be apparent from the following description.

SUMMARY OF THE INVENTION

The above and other beneficial objects and advantages are accomplished in accordance with the present invention by a compactable thermally insulated carrier comprising:

a) A Peltier effect thermal control device operable by 12 volts direct current and having a fan, a polarity switch, and power supply connection, b) a block of rigid closed cell polymeric foam disposed about said Peltier device, said block having an outer contour comprised of four flat sides disposed in a rectangular array, c) thermally insulative wall panel material of semi-rigid structure foldable to form a rectangular enclosure which surrounds and abuts the sides of said block, said wall material having reflective surfaces, and d) a thermally insulative outer jacket comprised of a self-inflating second panel of rectangular perimeter having opposed short edges, said panel further comprised of an air-impervious envelope equipped with a valve for control of air passage and a resilient open-celled slab of polymer foam confined within said envelope, said panel having interactive fastener material at said opposed short edges and having dimensions such that the panel can be folded about and secured upon said rectangular enclosure.

BRIEF DESCRIPTION OF THE DRAWING

For a fuller understanding of the nature and objects or the invention, reference should be had to the following detailed description taken in connection with the accompanying drawing forming a part of this specification and in which similar numerals of reference indicate corresponding parts in all the figures of the drawing.

DESCRIPTION OF THE PREFERRED EMBODIMENT

Figure 1:
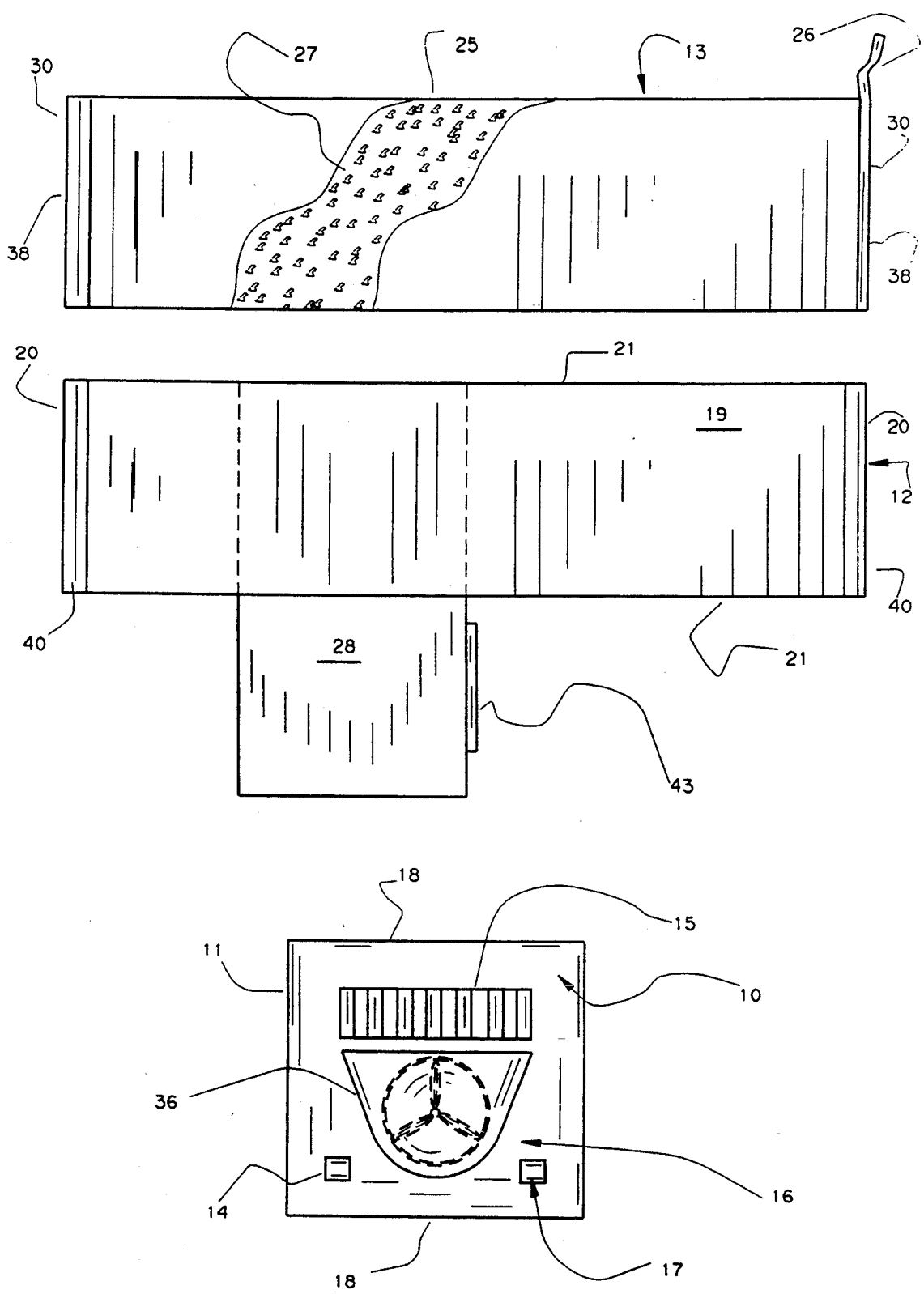
FIG. 1 is an exploded plan view showing the separate components of an embodiment of the carrier of this invention prior to assembly.
Figure 2:
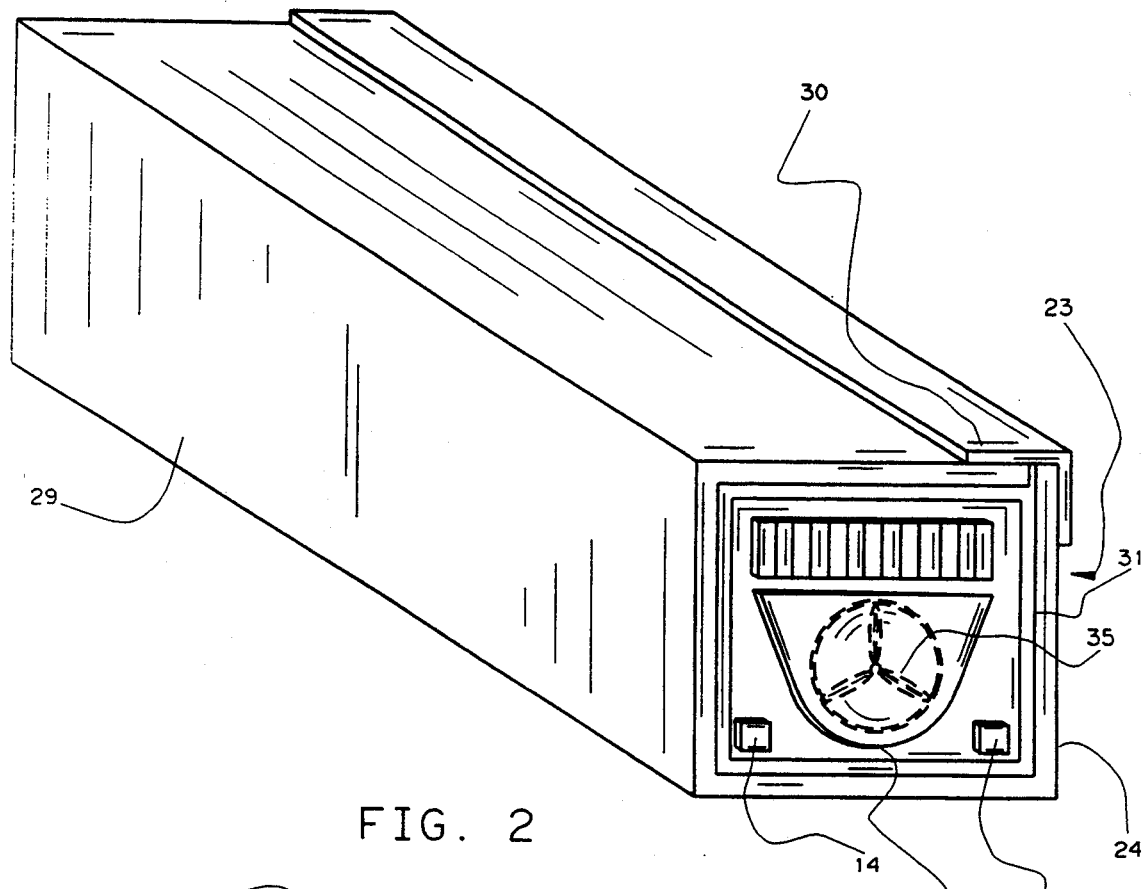
FIG. 2 is a rear perspective view of the carrier in its assembled state.
Figure 3:
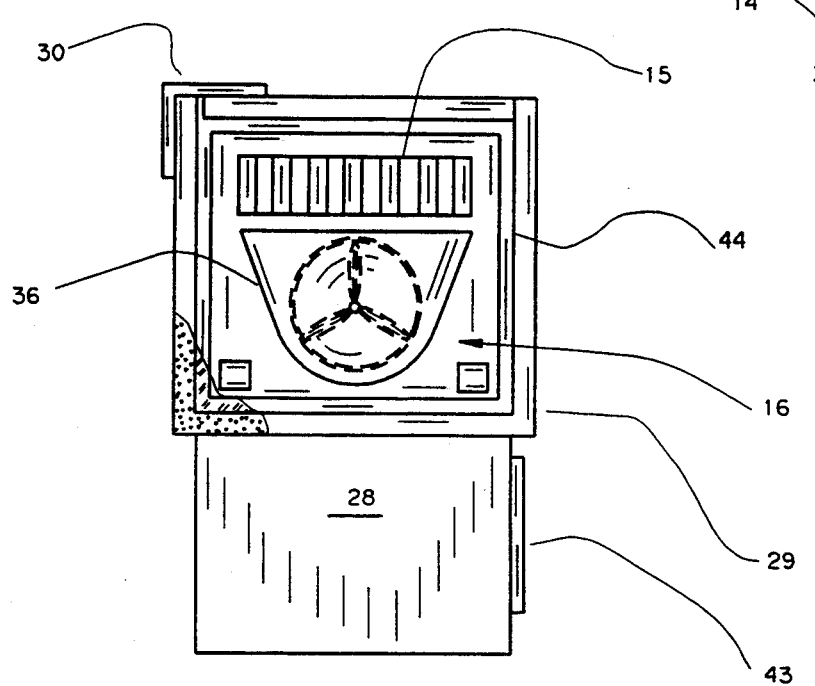
FIG. 3 is a front view of the assembled carrier with the door panel down to permit viewing through the carrier.

Referring to FIGS. 1-4, an embodiment of the insulated carrier 23 of the present invention is shown comprised of a Peltier effect thermal control device 10 disposed within a square block 11, a thermally insulative wall panel 12 folded about block 11, and outer jacket 13 disposed upon wall panel 12.

The Peltier device 10 may be of commercially available design adapted to operate on 12 volt direct current (DC) through connection socket 17, or may have a converter whereby alternating current is converted to 12 volt D.C. The device further comprises a polarity reversing switch 14 capable of selecting a cooling or heating mode of operation. Heat transfer vanes 15 positioned upon the device are located in a manner to receive a current of air generated by fan assembly 16 comprised of electric motor 33 having a shaft 34 attached to multi-bladed impeller 35. Said impeller is disposed within air portal 42 that penetrates block 11. The impeller is enclosed by a protective shroud 36 that directs air movement and promotes heat transfer with vanes 15.

Block 11 is preferably comprised of rigid closed cell polymeric foam such as polystyrene. Said block has four flat sides 18 disposed in a square array, and is intended to be disposed at the rear extremity 24 of carrier 23.

Wall panel 12 is fabricated of foldable material of semirigid structure. Suitable materials include bonded fiberglass or rockwood batting having a uniform thickness in the range of about 5 to 7 mm and having a reflective layer 19 on either or both surfaces. The reflective layer may be comprised of a film such as polyester having a reflective coating as may be produced by cold sputtering with aluminum. The film is adhered to the surface of the batting. Panel material of the aforesaid nature is sufficiently rigid so that it can be horizontally disposed in a self-supporting manner, yet is amenable to folding to form a box-like enclosure 31 having sidewalls 44 which closely embrace block 11. As shown in FIG. 1, panel 12 is an integral piece having opposed short sides 20 and opposed long sides 21. A flap 28, integral with panel 12 serves as a closure door for the front extremity 29 of the carrier. Wall panel 12 may also be fabricated of a slab of closed cell polymer foam or bubble wrap material having reflective film material adhered to both surfaces. Interactive fastener means such as VELCRO hook and loop material 40 may be attached to opposed short sides 20 to enable wall panel 12 to be releasibly secured about block 11. Similarly, a VELCRO strip 43 is attached to flap 28 to facilitate securement to said sidewalls.

Figure 4:
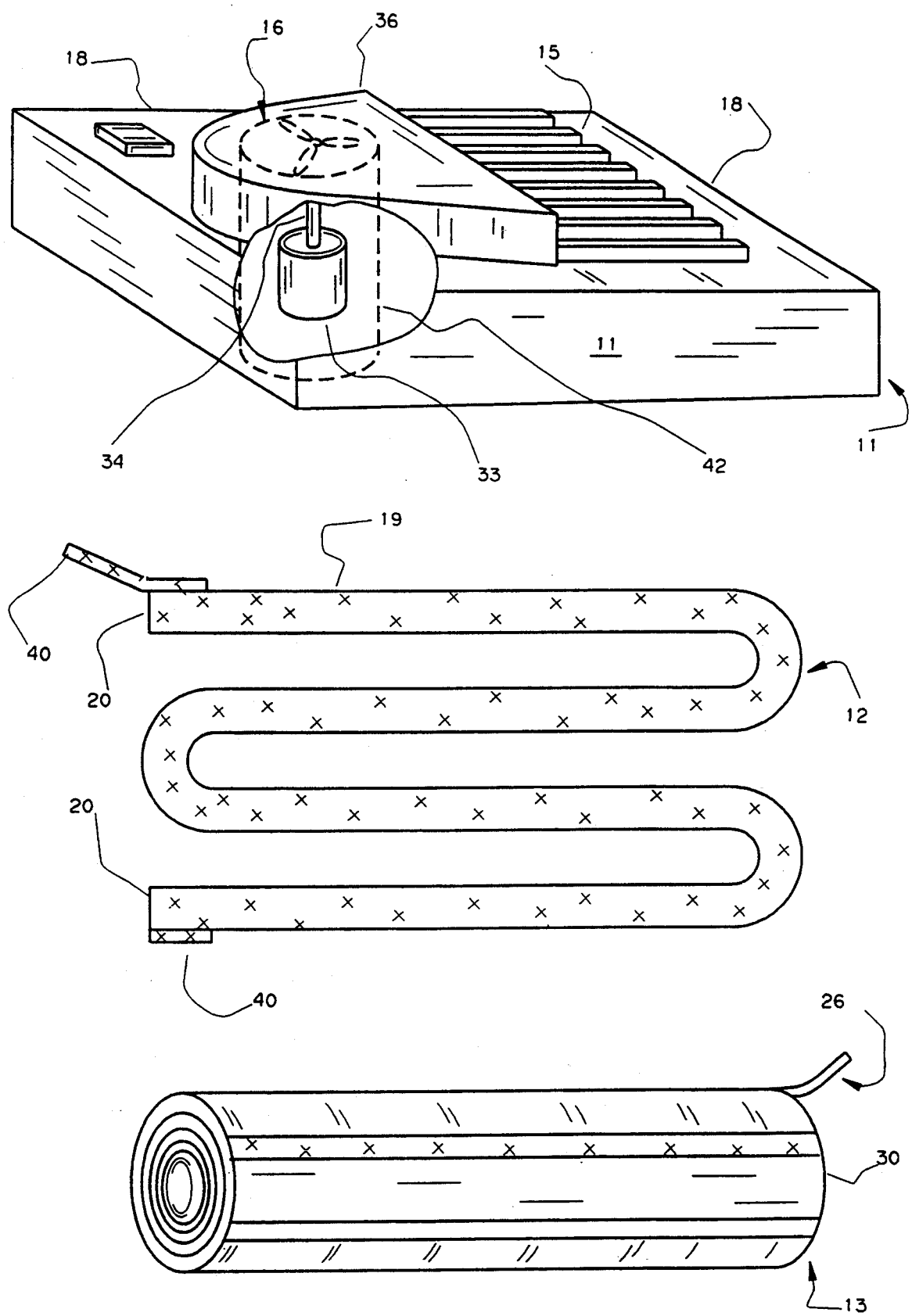
FIG. 4 is an exploded perspective view showing the separate components of the carrier of FIG. 2 in the storage state of the carrier.

Outer Jacket 13 is a thermally insulative, self-inflating structure of rectangular perimeter, said structure comprised of an air-impervious envelope 25 equipped with valve 26 for control of air passage, and a resilient open-celled slab 27 of polymer foam confined within said envelope. Outer jacket 13 is dimensioned such that it can be folded about wall panel 12 in its box-like disposition. Interactive fastener means such as VELCRO hook and loop material 30 attached to opposed short edges 38 of envelope 25 enable said jacket to be releasibly secured about wall panel 12. When not in use in forming the carrier device, outer jacket 13 can be compacted to a storage state of small volume, as shown in FIG. 4, by permitting air to exit envelope 25 via valve 26. Such removal of air facilitates compaction. Once compacted, the valve is closed. When it is desired to deploy the jacket again, valve 26 is opened. Such action causes the compacted resilient slab 27 to expand and draw air into envelope 25. Once jacket 13 is expanded, valve 26 is closed. Envelope 25 may have reflective material bonded thereto for further enhancement of its thermal insulative properties.

In keeping with the general applicability of the device of this invention for camping and travel situations, the individual components can be employed for a number of emergency first aid and/or survival purposes. For example, outer jacket 13 can be used as a splint for arm or leg fractures. In such use, the jacket is deflated, rolled around the injured limb and secured by taping or tying. Air is then forced through the valve into the jacket until suitable rigidity is achieved. The valve is then closed.

Jacket 13 may also be used as a sleeping pad for survival purposes or for treating a shock victim. The shock victim may either lie on the inflated jacket or use it as a cover in a deflated condition.

Wall panel 12 may be employed in situations similar to the aforesaid uses of jacket 13. Additionally, the wall panel, having a reflective surface, can be used as a signaling device in emergency situations.

Block 11 may be used to treat or assist in treating heat or cold injuries by direct contact with the skin of the afflicted person. The block may also be used to warm or cool intravenous solutions before or during infusion.

While particular examples of the present invention have been shown and described, it is apparent that changes and modifications may be made therein without departing from the invention in its broadest aspects. The aim of the appended claims, therefore, is to cover all such changes and modifications as fall within the true spirit and scope of the invention.

Having thus described my invention, what is claimed is:

1. A compactable thermally insulated carrier comprising:
    a) A Peltier effect thermal control device operable by 12 volts direct current and having a fan, a polarity switch, and power supply connection,
    b) a block of rigid closed cell polymeric foam disposed about said Peltier device, said block having an outer contour comprised of four flat sides disposed in a rectangular array,
    c) a first thermally insulative wall panel of semi-rigid structure foldable to form an elongated rectangular enclosure which surrounds and abuts the sides of said block, and extends to front and rear extremities, said wall material having reflective surfaces, and
    d) a thermally insulative outer jacket comprised of a self-inflating second panel of rectangular perimeter having opposed short edges, said second panel further comprised of an air-impervious envelope equipped with valve for control of air passage and a resilient open-celled slab of polymer foam confined within said envelope, said envelope having interactive fastener material at said opposed short edges and having dimensions such that the panel can be folded about and secured upon said rectangular enclosure.

2. The carrier of claim 1 wherein a rectangular flap, integral with one of said panels is adapted to fold away from said panel as a door for said front extremity.

3. The carrier of claim 2 wherein said Peltier device has a series of heat transfer vanes.

4. The carrier of claim 3 wherein said rigid block contains a portal for air passage, and electrically driven fan interactive with said portal, and a shroud that directs air flow past said vanes and through said portal.

5. The carrier of claim 4 wherein said first wall panel, said envelope, and flap are provided with VELCRO hook and loop attachment material to secure the integrity of the assembled carrier.

6. The carrier of claim 5 wherein the surfaces of said second panel contain a reflective layer.

7. The carrier of claim 6 wherein, in the assembled state of the carrier, the Peltier device is positioned at the rear extremity of the elongated rectangular enclosure with said vanes facing outwardly.

* * * * *